United States Patent [19]
Tanaka

[11] Patent Number: 5,371,569
[45] Date of Patent: Dec. 6, 1994

[54] MOUNTING APPARATUS OF FLEXIBLE PRINTED CIRCUIT BOARD

[75] Inventor: Hitoshi Tanaka, Tokyo, Japan

[73] Assignee: Asahi Kogaku Kogyo Kabushiki Kaisha, Tokyo, Japan

[21] Appl. No.: 79,200

[22] Filed: Jun. 21, 1993

[30] Foreign Application Priority Data

Jun. 23, 1992 [JP] Japan .................. 4-043583[U]

[51] Int. Cl.5 .................................... G03B 7/00
[52] U.S. Cl. ........................ 354/485; 354/286; 361/749; 439/162
[58] Field of Search ............ 354/485, 286; 361/749, 361/750, 751; 439/162

[56] References Cited

U.S. PATENT DOCUMENTS

| | | |
|---|---|---|
| 4,596,454 | 6/1986 | Kawai et al. ............ 354/286 |
| 4,711,548 | 12/1987 | Arakawa et al. ........ 354/485 |
| 4,804,331 | 2/1989 | Eguchi et al. .......... 439/162 |
| 4,864,348 | 9/1989 | Fujiwara et al. ........ 354/485 |
| 4,951,083 | 8/1990 | Okura et al. . |
| 4,990,948 | 2/1991 | Sasaki et al. ............ 354/485 |
| 5,012,273 | 4/1991 | Nakamura et al. . |
| 5,043,752 | 8/1991 | Kohmoto . |
| 5,051,764 | 9/1991 | Nomura . |
| 5,079,577 | 1/1992 | Nomura . |
| 5,144,493 | 9/1992 | Nomura . |
| 5,164,757 | 11/1992 | Nomura . |
| 5,231,449 | 7/1993 | Nomura . |

Primary Examiner—Russell E. Adams
Attorney, Agent, or Firm—Sandler, Greenblum & Bernstein

[57] ABSTRACT

A mounting apparatus of a flexible board which connects a first electrical member, movable in an optical axis direction, to a second electrical member, which is movable relative to the first electrical member. The apparatus includes a cylindrical support provided between the first and second electrical members, and an axially elongated mounting opening is provided in the cylindrical support, in which the flexible board can be received. An elastically deformable mounting member is fitted in the mounting opening by elastically deforming the same. The elastically deformable mounting member holds the flexible board, which is wrapped around the mounting member, in a manner such that the bent portion of the flexible board is perpendicular to the direction of relative movement of the first and second electrical members.

18 Claims, 7 Drawing Sheets

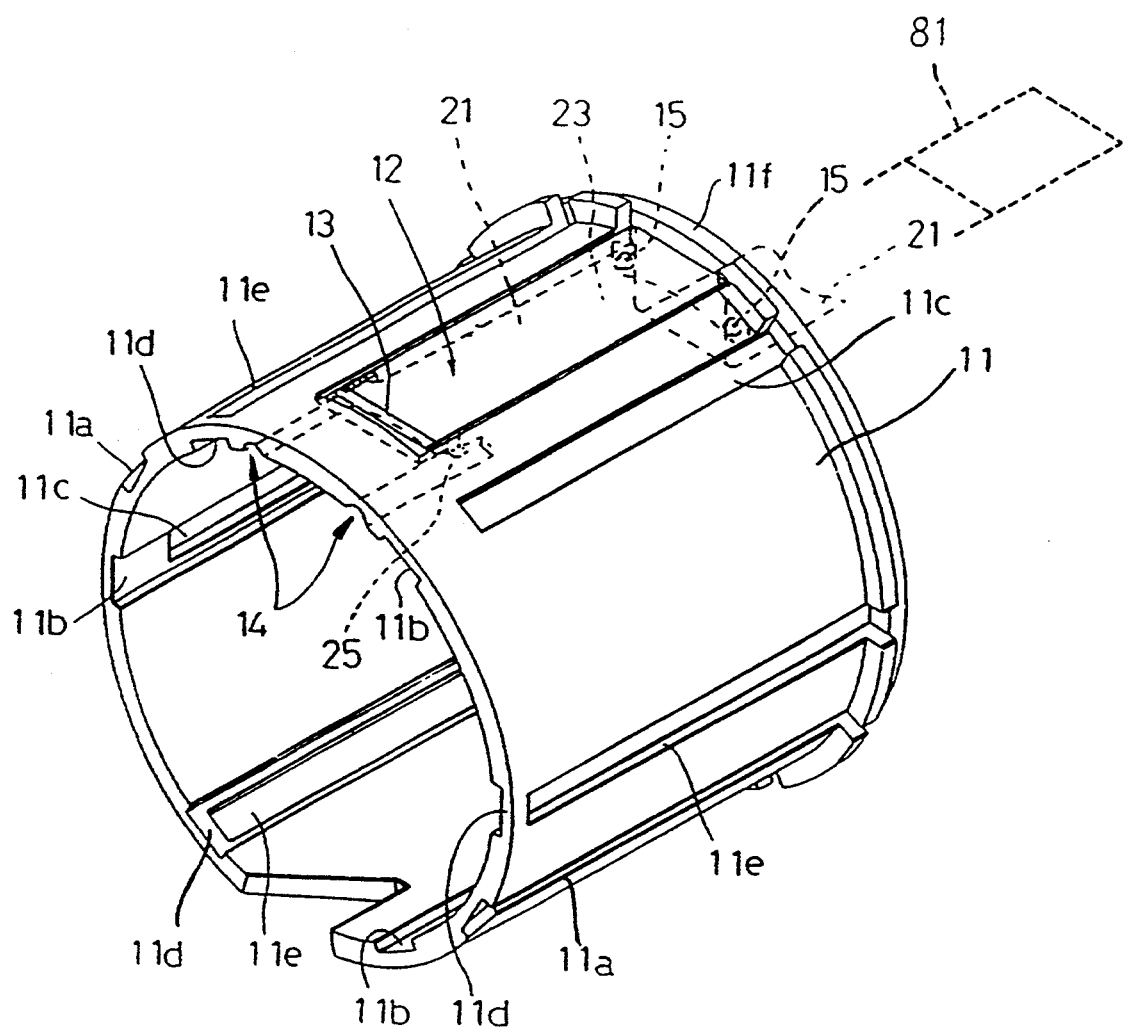
FIG. IA

MOUNTING APPARATUS OF FLEXIBLE PRINTED CIRCUIT BOARD

BACKGROUND OF THE INVENTION

1. Field of the Invention

The present invention relates to an apparatus for mounting and holding a flexible printed circuit board or sheet to a taking (i.e., photographing) lens or the like.

2. Description of Related Art

In a conventional compact camera having a bifocal or zoom lens, a flexible printed circuit board is used to electrically connect a lens controller (i.e., lens control unit), provided in a lens barrel to control the operations of an automatic focusing mechanism or an automatic aperture and shutter control mechanism, etc., and a body controller (i.e., camera body control unit), provided in a camera body. The lens controller is mounted to a movable frame which is supported by a holding frame or the lens barrel, etc. The movable frame is moved in an optical axis direction, for example, by a zooming operation. The flexible printed circuit board is secured, for example, to the lens barrel by machine screws or double-sided adhesive tape. However, such assembly of the flexible printed circuit board is very troublesome.

It is therefore an object of the present invention to eliminate the above-mentioned drawback by providing an apparatus in which a flexible printed circuit board can be simply mounted to a taking lens, etc.

SUMMARY OF THE INVENTION

According to the present invention, a mounting apparatus of a flexible board is provided which connects a first electrical member, movable in an optical axis direction, to a second electrical member which is movable relative to the first electrical member. The apparatus includes, a cylindrical support provided between the first and second electrical members, an axially elongated mounting opening provided in the cylindrical support, in which the flexible board can be received, and an elastically deformable mounting member which is fitted in the mounting opening by elastically deforming the same. The elastically deformable mounting member holds the flexible board which is wrapped around the mounting member in a manner such that the bent portion of the flexible board is perpendicular to the direction of relative movement of the first and second electrical members.

Preferably, the first electrical member includes an AF/AE (i.e., automatic focus/automatic exposure) unit having an electromagnetic shutter. The second electrical member includes a controller provided in a camera body to control the electromagnetic shutter.

The present disclosure relates to subject matter contained in Japanese Utility Model Application No. HEI 04-43583 (filed on Jun. 23, 1992) which is expressly incorporated herein by reference in its entirety.

BRIEF DESCRIPTION OF THE DRAWINGS

The invention will be described below in detail with reference to the accompanying drawings, in which:

FIG. 1A is a perspective view of an embodiment of a supporting ring to which a flexible printed circuit board mounting apparatus is attached, according to the present invention;

DESCRIPTION OF THE PREFERRED EMBODIMENT

Figure 1B:
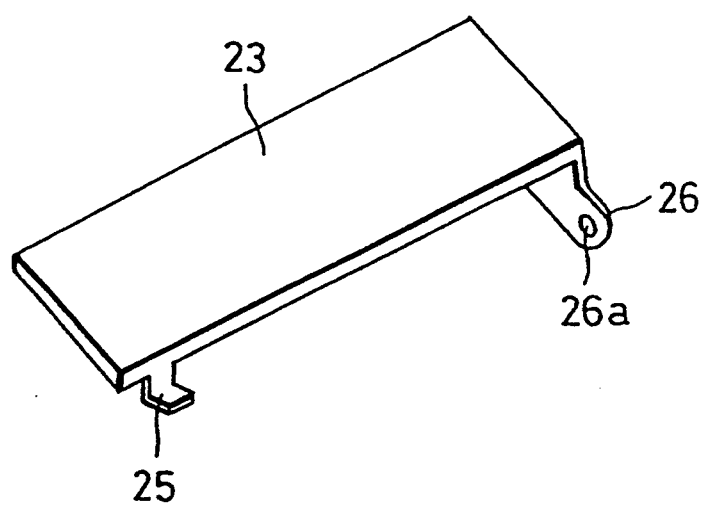
FIG. 1B is a schematic view of an FPC board mounting plate, according to the present invention.
Figure 2:
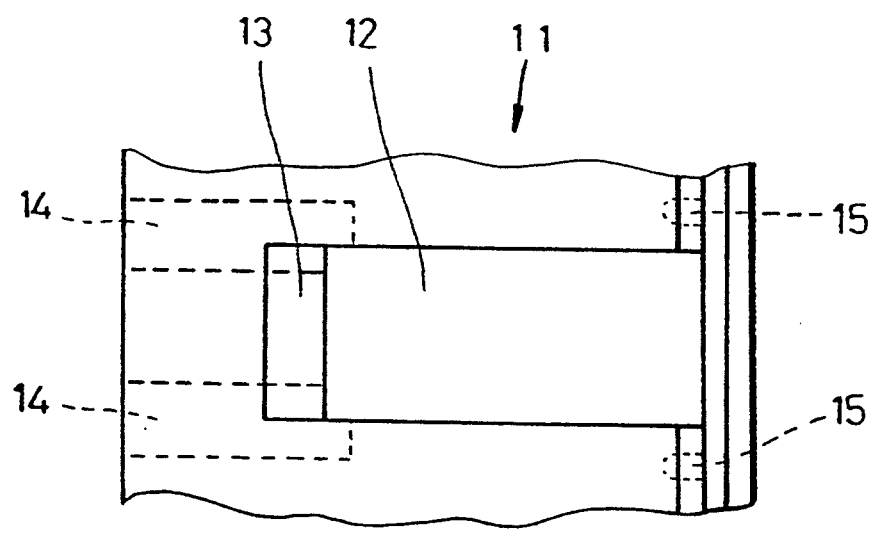
FIG. 2 is an external schematic view of the flexible printed circuit board mounting portion shown in FIG. 1.
Figure 3:
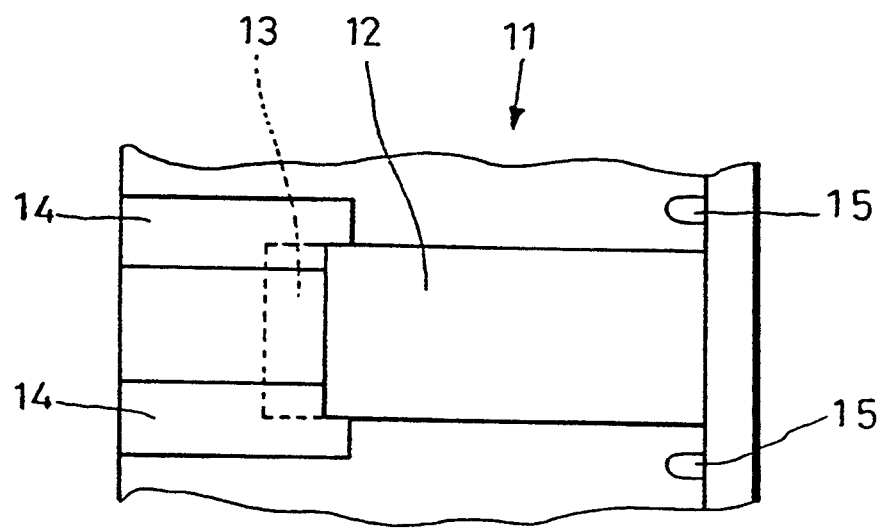
FIG. 3 is an internal schematic view of the flexible printed circuit board mounting portion shown in FIG. 1.

In FIGS. 1 through 3, left and right ends of a supporting ring (i.e., supporting frame) 11 correspond to a front end on the side of an object to be photographed, and a rear end on the side of a film, respectively.

Cylindrical supporting ring 11 is provided on the outer peripheral surface thereof with a flexible printed circuit board mounting opening (i.e., mounting opening) 12 which extends in the axial direction from a flange 11f provided at the rear end of the supporting ring 11. A flexible printed circuit board (i.e., an FPC board) 21 and a flexible printed circuit board mounting plate (i.e., a mounting plate) 23 are fitted in the mounting opening 12. Mounting opening 12 is provided on the front end thereof with a shoulder portion (i.e., stepped portion) 13. Supporting ring 11 is provided on the inner peripheral surface thereof with a pair of engaging grooves 14 on opposite sides of the shoulder portion 13. Flange 11f of the supporting ring 11 is provided with a pair of engaging projections 15 which are circumferentially spaced from one another and located on opposite sides of the mounting opening 12. Engaging projections 15 project toward the front end of the supporting ring 11.

Mounting plate 23 is preferably made of an elastic or flexible insulation material having a width slightly larger than that of the FPC board 21. Since the FPC board 21 is usually made of an insulation material, it is not always necessary to make the mounting plate 23 of an electrical insulation material.

The generally L-shaped mounting plate 23 is provided on the front end thereof with a holding portion 23a which can be disposed on the shoulder portion 13, and on the rear end thereof with a bent portion 23b which is bent substantially at a right angle. Mounting plate 23 is also provided with a pair of holding projections 25 on opposite sides of the holding portion 23a, so that when the latter is disposed on the shoulder portion 13, the holding projections 25 will engage with the engaging grooves 14 to hold the opposite edges of the shoulder portion 13 between the holding portion 23a and the holding projections 25. Bent portion 23b has an ear portion 26 which has a pair of engaging holes 26a in which the corresponding engaging projections 15 are fitted. Engaging projections 15 are spaced at a predetermined distance so that the FPC board 21 can be received therebetween.

FPC board 21 is connected at one end thereof, for example, to an AF/AE unit 43, discussed hereinafter, and extends backward along the inner surface of the supporting ring 11 and is bent forward again with a large curvature, as indicated at 21a. FPC board 21 is wrapped around the holding portion 23a of the mounting plate 23, as indicated at 21b, and extends rearwardly along the outer surface of the mounting plate 23. FPC board 21 is then bent along the bent end 23b of the mounting plate 23 and extends along a predetermined path to be connected to a controller 81 within the camera body.

Figure 7:
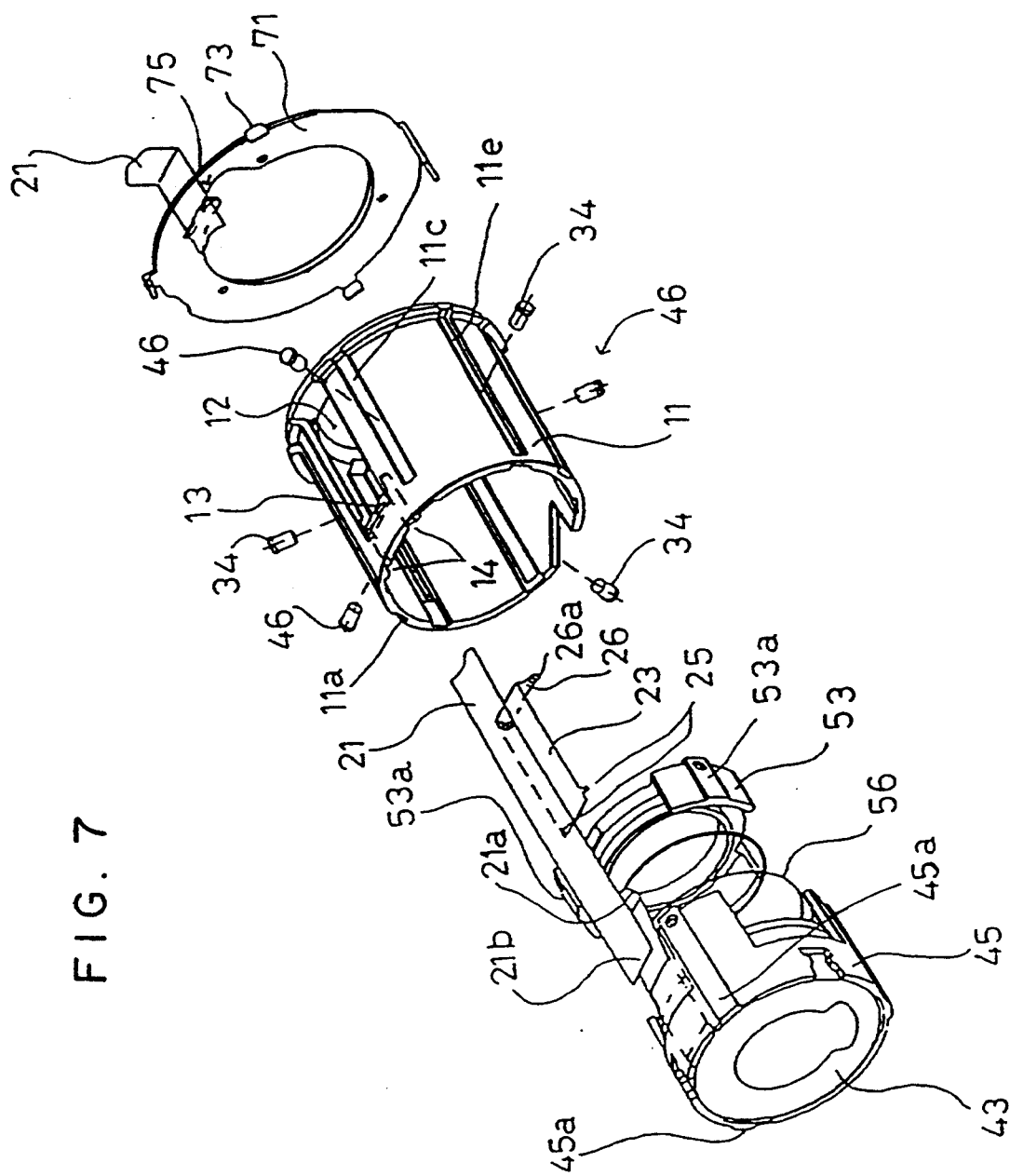
FIG. 7 is an exploded perspective view of main parts of a zoom lens of a lens shutter type camera having a flexible printed circuit board mounting apparatus incorporated therein, according to the present invention.
Figure 8:
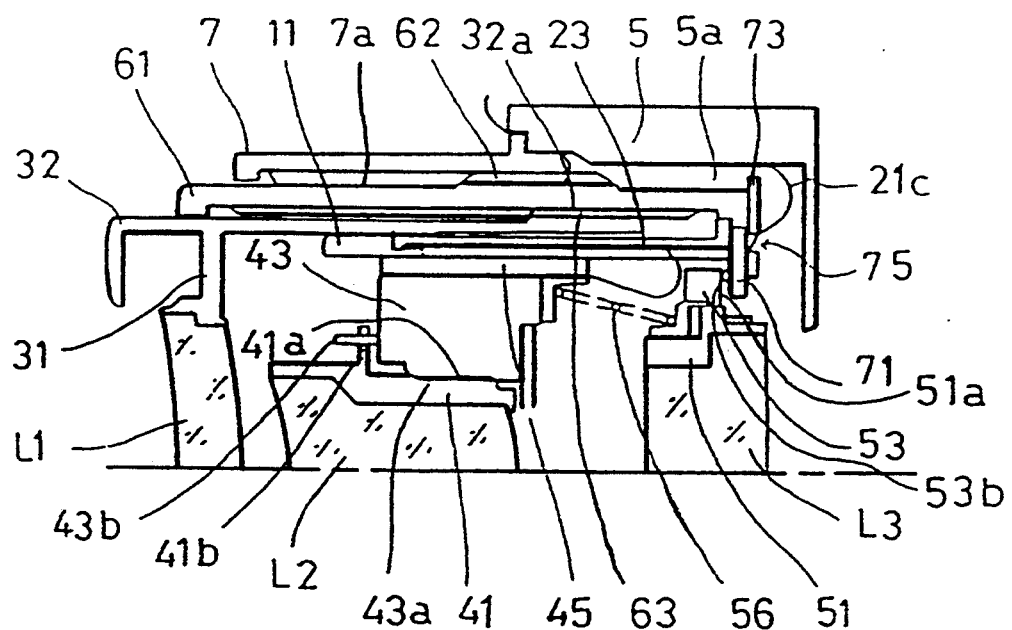
FIG. 8 is a sectional view of an upper half of the zoom lens in FIG. 7, shown in a wide-angle position; and, FIG. 9 is a sectional view of an upper half of a zoom lens in FIG. 7, shown in a telephoto position.
Figure 9:
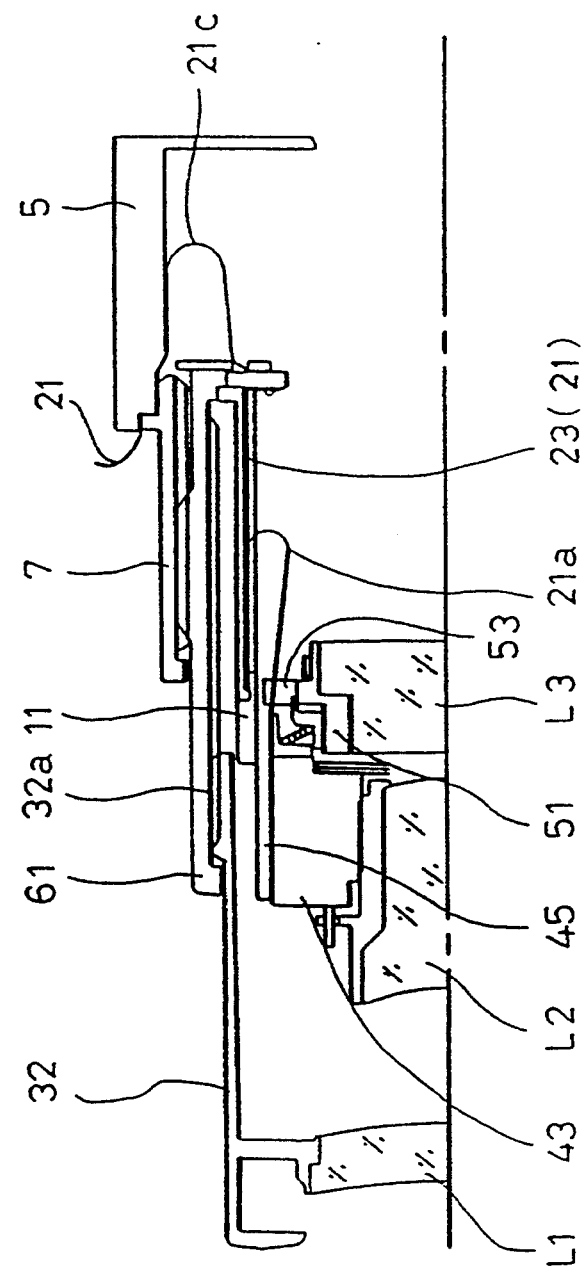

FIGS. 7 through 9 show an embodiment of a lens shutter type of zoom lens to which the present invention is applied.

The zoom lens includes three groups of lenses (first lens group L1, second lens group L2, and third lens group L3) which are movable relative to one another. A stationary member 5 is secured to the camera body (not shown) and is provided with a helicoid ring 7.

A first lens holding frame 31, which holds the first lens group L1, is formed integrally with a first lens barrel 32. First lens barrel 32 is provided on the outer peripheral surface thereof with a helicoid 32a which is in mesh with a helicoid 63 formed on an inner peripheral surface of the cam ring 61. First lens barrel 32 is also provided on the inner peripheral surface thereof with a linear movement guide key (not shown) which extends in the axial direction and which is slidably fitted in an axially extending key way 11a formed on the supporting ring 11.

Cam ring 61 is connected to the supporting ring 11 so as to rotate without moving in the axial direction. Helicoid 62, formed on the outer peripheral surface of the cam ring 61, is in mesh with a helicoid 7a formed on the inner peripheral surface of the helicoid ring 7.

A linear movement guide plate 71 is secured to the supporting ring 11 by machine screws. Linear movement guide plate 71 is provided with radially extending guide key projections 73 which are slidably fitted in corresponding linear movement guide key ways 5a formed on the stationary member 5. Consequently, when the cam ring 61 rotates about the optical axis X, the axial movement thereof in the optical axial direction takes place in accordance with the lead of the helicoids 62 and 7a engaged with each other. As a result, supporting ring 11 is moved together with the cam ring 61 in the optical axis direction X along the linear movement guide key ways 5a, so that the first lens barrel 32 moves in the optical axis direction X together with the cam ring 61. At the same time, relative movement of the first lens barrel 32 to the cam ring 61 in the optical axis direction X also occurs in accordance with the lead of the helicoids 63 and 32a.

A second lens holding frame 41, which holds the second lens group L2, is provided on the outer peripheral surface thereof with a helicoid 41a, which is engaged with a helicoid 43a formed on the inner peripheral surface of the cylindrical AF/AE unit 43. Second lens holding frame 41 has a projection 41b which projects in the radial direction and which is engaged by an AF drive lever 43b projecting from the AF/AE unit 43. The latter is fitted in a cylindrical second lens moving frame 45 and moves together therewith in the optical axis direction.

Second lens moving frame 45 is provided on the outer peripheral surface thereof with guide keys 45a which extend in the optical axis direction and which have guide rollers 46 (FIG. 7) mounted therein. Guide keys 45a are slidably fitted in axially extending guide key ways 11b formed in the inner peripheral surface of the supporting ring 11. Accordingly, second lens moving frame 45 is moved along the guide key ways 11b. Guide rollers 46 extend through the linear movement guide grooves 11c formed in the bottom of the guide key ways 11b, so that the front ends of the guide rollers 46 are fitted in a second cam groove (not shown) formed on the inner peripheral surface of cam ring 61. Namely, when cam ring 61 rotates, the AF/AE unit 43 is moved with respect to supporting ring 11, while being restricted by the movement of the intersection of the second cam groove and the linear movement guide grooves 11c.

A third lens holding frame 51 which holds the third lens group L3 is provided on the outer peripheral surface thereof with a threaded portion 51a which is in mesh with a threaded portion 53a formed on the inner peripheral surface of a third lens moving frame 53. Third lens moving frame 53 has three guide keys 53b which are formed on the outer peripheral surface thereof and which are slidably fitted in corresponding guide key ways 11d formed on the supporting ring 11.

Guide keys 53b have guide rollers 34 (FIG. 7) mounted therein, which extend through the linear movement guide grooves 11e formed in the guide key ways 11d, so that the front ends of guide rollers 34 are fitted in a third cam groove (not shown) formed on the inner peripheral surface of the cam ring 61. A coil spring 56 is provided between the second lens moving frame 45 and the third lens moving frame 53 to continuously bias them away from one another, thereby eliminating spaces between the guide rollers 46, 34 and the associated cam grooves.

As mentioned above, the FPC board 21, connected to the AF/AE unit 43, extends backwards along the inner peripheral surface of the supporting ring 11 and is bent forward again with a large curvature at the bent portion 21a. The FPC board 21 is then bent rearwardly at 21b and extends along the upper surface of the mounting plate 23. The FPC board 21 is then bent around the bent end 23b of the mounting plate 23 to enter the supporting ring 11 and is bent around the linear movement guide plate 71. The FPC board 21 is secured to the opening 12 of the supporting ring 11.

After being bent around the linear movement guide plate 71, the FPC board 21 extends through the FPC board holding groove 75 of the linear movement guide plate 71 and extends behind the cam ring 61 towards the stationary member 5. The FPC board 21 is then bent backward at the bent portion 21c to extend forward along the inner surface of the stationary member 5 and enters the camera body through a gap defined between the stationary member 5 and the helicoid ring 7, where it is connected to the controller 81.

The zoom lens operates as follows in accordance with the rotation of cam ring 61.

Cam ring 61 is rotated by a zoom motor (not shown) through the gear train and the gear (not shown) provided on the outer peripheral surface of the cam ring 61 to transmit the rotation of the zoom motor. Consequently, cam ring 61 is moved in the optical axis direction in accordance with the lead of the helicoids 43 and 7a, while being rotated about the optical axis, as mentioned before. As a result, supporting ring 11 is moved together with cam ring 61 in the optical axis direction along the linear movement guide key ways 5a, so that second lens moving frame 45 and, accordingly, the AF/AE unit 43, are axially moved together with the cam ring 61. During this movement, the movement of the AF/AE unit 43, relative to cam ring 61, is caused by the restriction of the second cam groove.

It should be appreciated that during the relative movement of the AF/AE unit 43, with respect to the supporting ring 11, the FPC board 21 elastically deforms at the bent portion 21a thereof in accordance with the movement of the AF/AE unit 43. When the supporting ring 11 is moved in the optical axis direction relative to the stationary member 5, the displacement of bent portion 21c of the FPC board 21 takes place, so that the FPC board 21 permits movement of the supporting ring 11 in the optical axis direction.

Figure 4:
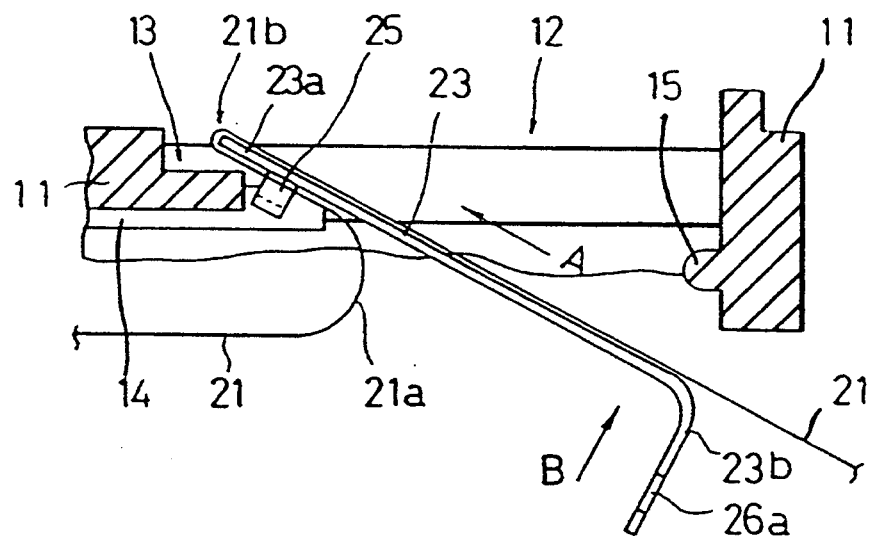
FIGS. 4, 5 and 6 are sectional views of a flexible printed circuit board mounting portion shown in different positions.
Figure 5:
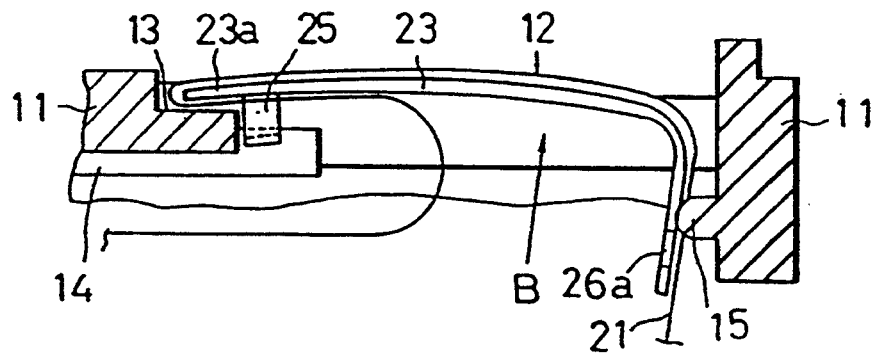
Figure 6:
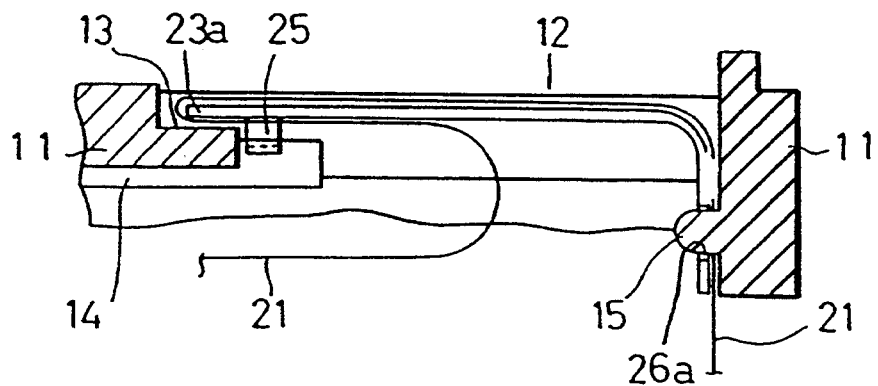

The attachment of the mounting plate 23 will be discussed below with reference to FIGS. 4 through 6.

First, the FPC board 21 is bent at bent portion 21b to hold the holding portion 23a of mounting plate 23 between the bent portion and the remaining portion of the FPC board 21. In this state, the AF/AE unit 43, etc., are mounted to the supporting ring 11, and the FPC board 21 and the mounting plate 23 are inserted in the supporting ring 11. Thereafter, the holding portion 23a is protruded outward through the opening 12 and pushed forward (in the direction A), so that the holding portion 23a is located on the shoulder portion 13, as shown in FIG. 4.

Thereafter, when the bent portion 23b or the portion in the vicinity thereof is pressed upward in the direction B thereby causing a protrusion of the associated portion of the FPC board 21 from the opening 12, the engaging projections 25 are engaged in the corresponding engaging grooves to prevent the holding portion 23a from being detached from the shoulder portion 13. Accordingly, the mounting plate 23 is entirely and elastically deformed or deflected upwardly. Consequently, the mounting plate 23 is positioned in the opening 12, while bringing the bent portion 23b into sliding contact with the engaging projections 15 (see FIG. 5).

As soon as the engaging projections 15 are registered with the engaging holes 26a, the engaging projections 15 are fitted in the engaging holes 26a, so that the mounting plate 23 is returned to the free state (i.e., flat plate state) thereof by the elastic restoring force. Namely, the holding portion 23a of the mounting plate 23 and the holding projections 25 hold the shoulder portion 13 of the supporting ring 11, and the engaging projections 15 are engaged in the engaging holes 26a. Consequently, the FPC board 21, which is bent at the holding portion 23a, and the shoulder portion 13, can be secured to the supporting ring 11, as shown in FIG. 6.

As can be seen from the above discussion, according to the present invention, the intermediate portion of the FPC board 21 can be easily mounted to the supporting ring 11 by fitting the mounting plate 23 in the opening 12. Furthermore, since the mounting plate 23 is firmly held, not only by the engagement, at the front end 23a, of the holding projections 25 and the shoulder portion 13, but also by the engagement of the engaging projections 15 and the corresponding engaging holes 26a, the FPC board will not be accidentally detached from the supporting ring 11 as a result of aging, etc.

The present invention is not limited to the illustrated embodiment discussed above. In summary, the present invention is generically addressed to a basic concept in which a stationary portion to which a flexible board or sheet is to be mounted is provided with holes, grooves, or openings, etc., so that the flexible board or sheet can be mounted to the stationary portion, using a mounting plate which can be engaged in the holes, grooves, or openings etc.

As can be understood from the foregoing, according to the present invention, the mounting operation of a flexible printed circuit board (particularly the intermediate portion thereof) which connects an electrical member, which moves in accordance with the zooming or focusing operation, to a controller, provided in a camera body, is simplified by mounting the circuit board to a supporting ring through a mounting member. Furthermore, the flexible printed circuit board can even be effectively secured to a stationary portion in which a securing means, such as screws or adhesive etc., is not used.

I claim:

1. A mounting apparatus of a flexible board which connects a first electrical member, movable in a first predetermined, direction, to a second electrical member, said second electrical member movable relative to said first electrical member, comprising:
   a support provided between the first and second electrical members;
   an axially elongated mounting opening provided in the support in which the flexible board can be received; and
   an elastically deformable mounting member which is fitted in the mounting opening by elastically deforming the mounting member, said mounting member comprises means for holding the flexible board, such that the flexible board is wrapped around the mounting member in a manner such that the bent portion of the flexible board is perpendicular to the direction of relative movement of the first and second electrical members.

2. A mounting apparatus according to claim 1, wherein said support comprises a cylindrical supporting ring.

3. A mounting arrangement according to claim 2, said cylindrical supporting ring having first and second ends spaced along the predetermined direction, a flange which can be secured to a camera body is provided on the first end of said cylindrical supporting ring.

4. A mounting apparatus according to claim 1, wherein said flexible board is a flexible printed circuit board.

5. A mounting apparatus according to claim 2, wherein said first electrical member is comprised of a automatic focus/automatic exposure unit having an electromagnetic shutter.

6. A mounting apparatus according to claim 5, wherein said second electrical member comprises a control means provided in a camera body to control an electromagnetic shutter.

7. A mounting apparatus according to claim 4, the mounting member comprising a mounting plate said mounting opening having first and second ends, and having a shoulder portion at the first end of the mounting opening on which the mounting plate is located, said shoulder portion serving to hold the flexible printed circuit board between the mounting plate and the shoulder portion.

8. A mounting apparatus according to claim 7, wherein said mounting plate is provided with holding projections which engage with an inner edge of the supporting ring, defining the mounting opening, to hold the flexible printed circuit board on the shoulder portion.

9. A mounting apparatus according to claim 3, wherein said mounting opening extends forward from a flange of the supporting ring.

10. A mounting apparatus according to claim 9, wherein said mounting member is comprised of a mounting plate, and wherein said mounting opening is defined by first and second ends, a shoulder portion being provided on the first end of said mounting opening, the mounting plate is located on the shoulder portion to hold the flexible printed circuit board between the mounting plate and the shoulder portion.

11. A mounting apparatus according to claim 10, wherein said mounting plate is provided with holding projections which engage with an edge of the supporting ring defining the mounting opening to hold the flexible printed circuit board on the shoulder portion.

12. A mounting apparatus according to claim 11, wherein said flange is provided with engaging projections which project from said flange in a direction towards said second end of said cylindrical supporting ring, said engaging portions being provided in the vicinity of the mounting opening, and wherein said mounting plate is provided with a bent portion adjacent to the flange of the cylindrical supporting ring, said bent portion being provided with engaging holes in which the engaging projections can be engaged.

13. A mounting apparatus according to claim 12, said flexible printed circuit board extending along a first surface of the flange between the first surface and the bent portion of the mounting plate; extends from the bent portion along a first surface of the mounting plate in a direction towards the second end of the cylindrical supporting ring; is bent at an end of the mounting plate opposite the bent portion to pass between the shoulder portion and the mounting plate and to extend towards the flange; is bent before reaching the flange; and is connected to the first electrical member.

14. A mounting apparatus of a flexible board according to claim 1, said mounting apparatus being adapted for use in a camera having a camera body and a lens defining an optical axis, said lens being attached to said camera body.

15. A mounting apparatus of a flexible board according to claim 14, said support comprising a cylindrical supporting ring, a flange provided on an end of said cylindrical supporting ring, said flange enabling the cylindrical supporting ring to be secured to the camera body.

16. The amounting apparatus according to claim 14, the second electrical member comprising control means provided in the camera body for controlling an electromagnetic shutter of the camera.

17. The mounting apparatus according to claim 4, said support comprising a cylindrical supporting ring, said ring having a flange, said mounting plate having a bent portion adapted to be positioned adjacent the flange of the cylindrical supporting ring, the mounting opening having a shoulder portion, wherein said flexible printed circuit board extends along a surface of the flange between the flange and the bent portion of the mounting plate, along a surface of the mounting plate in a direction extending from the bent portion, is bent at an end of the mounting plate opposite the bent portion to pass between the shoulder portion and the mounting plate, is bent before reaching the flange of the cylindrical supporting ring, and is connected to the first electrical member.

18. The mounting apparatus according to claim 2, said cylindrical supporting ring provided with at least one axially extending key way for engaging a linear movement guide key of a lens barrel.

* * * * *

UNITED STATES PATENT AND TRADEMARK OFFICE
CERTIFICATE OF CORRECTION

PATENT NO. : 5,371,569
DATED : December 6, 1994
INVENTOR(S) : Hitoshi TANAKA

It is certified that error appears in the above-indentified patent and that said Letters Patent is hereby corrected as shown below:

At column 6, line 52 (claim 5, line 2), change "a" to ---an---.

At column 7, line 7 (claim 9, line 3), change "supporting" to ---cylindrical supporting---.

Signed and Sealed this

Twentieth Day of June, 1995

*Attest:*

BRUCE LEHMAN

*Attesting Officer*   *Commissioner of Patents and Trademarks*